(12) United States Patent
Kim et al.

(10) Patent No.: US 11,768,570 B2
(45) Date of Patent: Sep. 26, 2023

(54) INPUT SENSING UNIT AND DISPLAY DEVICE HAVING THE SAME

(71) Applicant: Samsung Display Co., Ltd., Yongin-si (KR)

(72) Inventors: Jong-Hwa Kim, Yongin-si (KR); Wonkyu Kwak, Seongnam-si (KR); Jeongyun Han, Hwaseong-si (KR); Kyungsu Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/827,793

(22) Filed: May 30, 2022

(65) Prior Publication Data

US 2022/0291783 A1 Sep. 15, 2022

Related U.S. Application Data

(63) Continuation of application No. 17/115,636, filed on Dec. 8, 2020, now Pat. No. 11,347,364.

(30) Foreign Application Priority Data

Feb. 17, 2020 (KR) .......................... 10-2020-0018822

(51) Int. Cl.
*H10K 59/12* (2023.01)
*H10K 59/40* (2023.01)
(Continued)

(52) U.S. Cl.
CPC .......... *G06F 3/0446* (2019.05); *G06F 3/0443* (2019.05); *G06F 3/04164* (2019.05);
(Continued)

(58) Field of Classification Search
CPC ...... G06F 3/047; G06F 3/0412; G06F 3/0416; G06F 3/04164; G06F 3/0446;
(Continued)

(56) References Cited

U.S. PATENT DOCUMENTS 9,335,881 B2 5/2016 Jeong
9,798,419 B2 10/2017 Kim et al.
(Continued)

FOREIGN PATENT DOCUMENTS

| KR | 10-2015-0027681 | 3/2015 |
| KR | 10-2016-0080311 | 7/2016 |
| KR | 10-1941255 | 1/2019 |

OTHER PUBLICATIONS

Non-Final Office Action dated Feb. 2, 2022, in U.S. Appl. No. 17/115,636.
(Continued)

*Primary Examiner* — Nitin Patel
*Assistant Examiner* — Amen W Bogale
(74) *Attorney, Agent, or Firm* — H.C. Park & Associates, PLC

(57) ABSTRACT

An input sensing unit including: a first sensing electrode, a second sensing electrode insulated from the first sensing electrode, a first sensing line connected to one end of the first sensing electrode, a second sensing line connected to the other end of the first sensing electrode, a third sensing line connected to one end of the second sensing electrode, a first bridge pattern connecting the first sensing line and the second sensing line, a second bridge pattern substantially parallel to the first bridge pattern, and a pad connected to the second bridge pattern. The first bridge pattern extends in a first direction and overlaps the first sensing electrode in the first direction, and the pad is disposed closer to the second bridge pattern than the first bridge pattern. Thus, the input sensing unit has improved reliability.

13 Claims, 13 Drawing Sheets

(51) Int. Cl.
    *G09G 3/3275*         (2016.01)
    *G09G 3/3233*         (2016.01)
    *G09G 3/3266*         (2016.01)
    *G06F 3/044*          (2006.01)
    *G06F 3/041*          (2006.01)

(52) U.S. Cl.
    CPC ............. H10K 59/12 (2023.02); H10K 59/40 (2023.02); *G06F 2203/04111* (2013.01); *G09G 3/3233* (2013.01); *G09G 3/3266* (2013.01); *G09G 3/3275* (2013.01)

(58) Field of Classification Search
    CPC ........ G06F 3/0443; G06F 3/041; G06F 3/044; G06F 3/0448; G06F 3/0445; G06F 2203/04111; G06F 2203/04103; G06F 2203/04112; H01L 27/3276; H01L 27/323; H10K 59/12; H10K 59/40
    See application file for complete search history.

(56) References Cited

U.S. PATENT DOCUMENTS

| | | | |
|---|---|---|---|
| 10,133,395 B2* | 11/2018 | Kim | G06F 3/0443 |
| 2009/0085891 A1 | 4/2009 | Yang et al. | |
| 2010/0085326 A1* | 4/2010 | Anno | H03K 17/9622 |
| | | | 345/174 |
| 2010/0253646 A1* | 10/2010 | Hiratsuka | G06F 3/0446 |
| | | | 345/174 |
| 2013/0106747 A1* | 5/2013 | Choi | G06F 3/0443 |
| | | | 345/173 |
| 2014/0028599 A1* | 1/2014 | Jeong | G06F 3/047 |
| | | | 345/173 |
| 2014/0138141 A1* | 5/2014 | Li | G06F 3/041 |
| | | | 174/261 |
| 2014/0184950 A1* | 7/2014 | Chu | G06F 3/0446 |
| | | | 349/12 |
| 2015/0185935 A1* | 7/2015 | Jang | G06F 3/04166 |
| | | | 345/174 |
| 2015/0253897 A1* | 9/2015 | Liang | H01B 5/00 |
| | | | 174/126.1 |
| 2016/0139708 A1* | 5/2016 | Tseng | G06F 3/0418 |
| | | | 345/174 |
| 2016/0188114 A1* | 6/2016 | Kim | G06F 3/0446 |
| | | | 345/174 |
| 2016/0195967 A1* | 7/2016 | Lee | G06F 3/0443 |
| | | | 345/173 |
| 2017/0153726 A1* | 6/2017 | Lee | G06F 3/0446 |
| 2018/0308903 A1* | 10/2018 | Jeong | H01L 27/3276 |
| 2019/0041441 A1* | 2/2019 | Higuchi | G06F 3/0443 |
| 2020/0110484 A1* | 4/2020 | Kim | G06F 3/0446 |
| 2020/0159350 A1* | 5/2020 | Yang | G06F 3/0412 |
| 2020/0319729 A1* | 10/2020 | Yang | G06F 3/04164 |
| 2020/0401276 A1* | 12/2020 | Yang | G06F 3/0443 |
| 2021/0011602 A1* | 1/2021 | Song | G06F 3/0444 |
| 2021/0048936 A1* | 2/2021 | Cui | G06F 3/04166 |
| 2021/0223910 A1* | 7/2021 | Yang | G06F 3/04164 |
| 2021/0247866 A1* | 8/2021 | Kim | G06F 3/04164 |

OTHER PUBLICATIONS

Notice of Allowance dated Jul. 23, 2021, in U.S. Appl. No. 17/115,636.

* cited by examiner

INPUT SENSING UNIT AND DISPLAY DEVICE HAVING THE SAME

CROSS-REFERENCE TO RELATED APPLICATION

This U.S. non-provisional patent application claims priority under 35 U.S.C. § 119 of Korean Patent Application No. 10-2020-0018822, filed on Feb. 17, 2020, the contents of which are hereby incorporated by reference in its entirety.

BACKGROUND

1. Field of Disclosure

The present disclosure relates to an input sensing unit and a display device having the same. More particularly, the present disclosure relates to an input sensing unit having an improved reliability and a display device having the input sensing unit.

2. Description of the Related Art

A display device is activated in response to electrical signals. The display device includes devices including a variety of electronic components, such as a display panel displaying an image or an input sensing unit sensing an input. The electronic components are electrically connected to each other by signal lines arranged in various ways.

The electronic components are electrically connected to external circuits through pads. As a degree of integration of the electronic components increases and the number of signal lines increases, the number of required pads increases. In addition, when the number of the signal lines increases, a fine-patterning process is required to form fine-sized signal lines.

SUMMARY

The present disclosure provides an input sensing unit having an improved reliability.

The present disclosure provides a display device having the input sensing unit.

Embodiments of the inventive concept provide an input sensing unit including a first sensing electrode extending in a first direction, a second sensing electrode extending in a second direction crossing the first direction and insulated from the first sensing electrode, a first sensing line connected to one end of the first sensing electrode, a second sensing line connected to the other end of the first sensing electrode, a third sensing line connected to one end of the second sensing electrode, a first bridge pattern connecting the first sensing line and the second sensing line, a second bridge pattern substantially parallel to the first bridge pattern in the second direction, and a pad connected to the second bridge pattern. The first bridge pattern extends in the first direction and overlaps the first sensing electrode in the first direction, and the pad is disposed closer to the second bridge pattern than the first bridge pattern.

The first bridge pattern is disposed closer to the one end of the first sensing electrode than the other end of the first sensing electrode.

The first sensing line includes a first front sensing line connecting the one end of the first sensing electrode to the first bridge pattern and a first rear sensing line connecting the first bridge pattern to the second bridge pattern, and the first rear sensing line extends from the first front sensing line.

The first bridge pattern and the second bridge pattern include a transparent conductive oxide.

The second sensing line includes a second front sensing line connecting the other end of the first sensing electrode to the first bridge pattern and a second rear sensing line connecting the first bridge pattern to the second bridge pattern, and the second rear sensing line extends from the second front sensing line.

The first bridge pattern is disposed on a first layer, and the first sensing line and the second sensing line are disposed on a second layer.

The second layer is disposed on the first layer.

The first layer is disposed on the second layer.

The first sensing electrode includes a plurality of first sensing patterns and a plurality of first connection patterns each being disposed between the first sensing patterns and connecting the first sensing patterns adjacent to each other. The second sensing electrode includes a plurality of second connection patterns disposed on a different layer from the first connection patterns and a plurality of second sensing patterns connected to the second connection patterns, and the first sensing patterns and the second sensing patterns are disposed on a same layer as the first bridge pattern.

Embodiments of the inventive concept provide an input sensing unit including a plurality of first sensing electrodes extending in a first direction, a plurality of second sensing electrodes extending in a second direction crossing the first direction and insulated from the first sensing electrodes, a plurality of first sensing lines connected to one end of each of the first sensing electrodes, a plurality of second sensing lines connected to the other end of each of the first sensing electrodes, a plurality of third sensing lines connected to one end of each of the second sensing electrodes, a plurality of first bridge patterns connecting the first sensing lines to the second sensing lines, respectively, a second bridge pattern disposed to be substantially parallel to the first bridge patterns in the second direction, and a pad connected to the second bridge pattern. Each of the first bridge patterns extends in the first direction and overlaps each of the first sensing electrodes in the first direction, and the pad is disposed closer to the second bridge pattern than the first bridge pattern.

The first sensing electrodes include an (n−1)th column first sensing electrode and an n-th column first sensing electrode spaced apart from the (n−1)th column first sensing electrode in the second direction, the first bridge patterns include an (n−1)th column first bridge pattern and an n-th column first bridge pattern spaced apart from the (n−1)th column first bridge pattern in the second direction, the (n−1)th column first bridge pattern overlaps the (n−1)th column first sensing electrode in the first direction, the n-th column first bridge pattern overlaps the n-th column first sensing electrode in the first direction, and the "n" is an integer number equal to or greater than 5.

The (n−1)th column first bridge pattern has a length longer than a length of the n-th column first bridge pattern, and the (n−1)th column first bridge pattern is disposed closer to the pad than the n-th column first bridge pattern is.

Each of the first sensing lines includes a first front sensing line connecting the one end of a corresponding first sensing electrode among the first sensing electrodes to the first bridge pattern corresponding to the first sensing electrode and a first rear sensing line connecting the first bridge pattern connected to the first front sensing line to the second bridge pattern corresponding to the first bridge pattern, and the first rear sensing line extends from the first front sensing line.

Each of the second sensing lines includes a second front sensing line connecting the other end of a corresponding the first sensing electrode among the first sensing electrodes to the first bridge pattern corresponding to the first sensing electrode and a second rear sensing line connecting the first bridge pattern connected to the second front sensing line to the second bridge pattern corresponding to the first bridge pattern, and the second rear sensing line extends from the second front sensing line.

Embodiments of the inventive concept provide a display device including a display panel including a plurality of light emitting elements and an input sensing unit disposed on the display panel. The input sensing unit includes a base layer, a first sensing electrode disposed on the base layer and extending in a first direction, a second sensing electrode extending in a second direction crossing the first direction and insulated from the first sensing electrode, a first sensing line connected to one end of the first sensing electrode, a second sensing line connected to the other end of the first sensing electrode, a third sensing line connected to one end of the second sensing electrode, a first bridge pattern connecting the first sensing line and the second sensing line, a second bridge pattern substantially parallel to the first bridge pattern in the second direction, and a pad. The first bridge pattern extends in the first direction and overlaps the first sensing electrode in the first direction, and the pad is disposed closer to the second bridge pattern than the first bridge pattern.

The first bridge pattern is disposed closer to the one end of the first sensing electrode than the other end of the first sensing electrode.

The first sensing line includes a first front sensing line connecting the one end of the first sensing electrode to the first bridge pattern and a first rear sensing line connecting the first bridge pattern to the second bridge pattern, and the first rear sensing line extends from the first front sensing line.

The second sensing line includes a second front sensing line connecting the other end of the first sensing electrode to the first bridge pattern and a second rear sensing line connecting the first bridge pattern to the second bridge pattern, and the second rear sensing line extends from the second front sensing line.

The first sensing electrode includes a plurality of first sensing patterns and a plurality of first connection patterns each being disposed between the first sensing patterns and connecting the first sensing patterns adjacent to each other. The second sensing electrode includes a plurality of second connection patterns disposed on a different layer from the first connection patterns and a plurality of second sensing patterns connected to the second connection patterns, and the first sensing patterns and the second sensing patterns are disposed on a same layer as the first bridge pattern.

The base layer includes a first area and a second area adjacent to the first area, the first sensing electrode and the second sensing electrode overlap the first area, the first to third sensing lines and the first bridge pattern overlap the second area, and the light emitting elements overlap the first area.

According to the above, the signal lines that transmit the data signal are arranged to be spaced apart from each other. Therefore, the reliability of the input sensing unit may be improved, and the input sensing unit may be prevented from being damaged due to electrostatic discharge (ESD).

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1A:
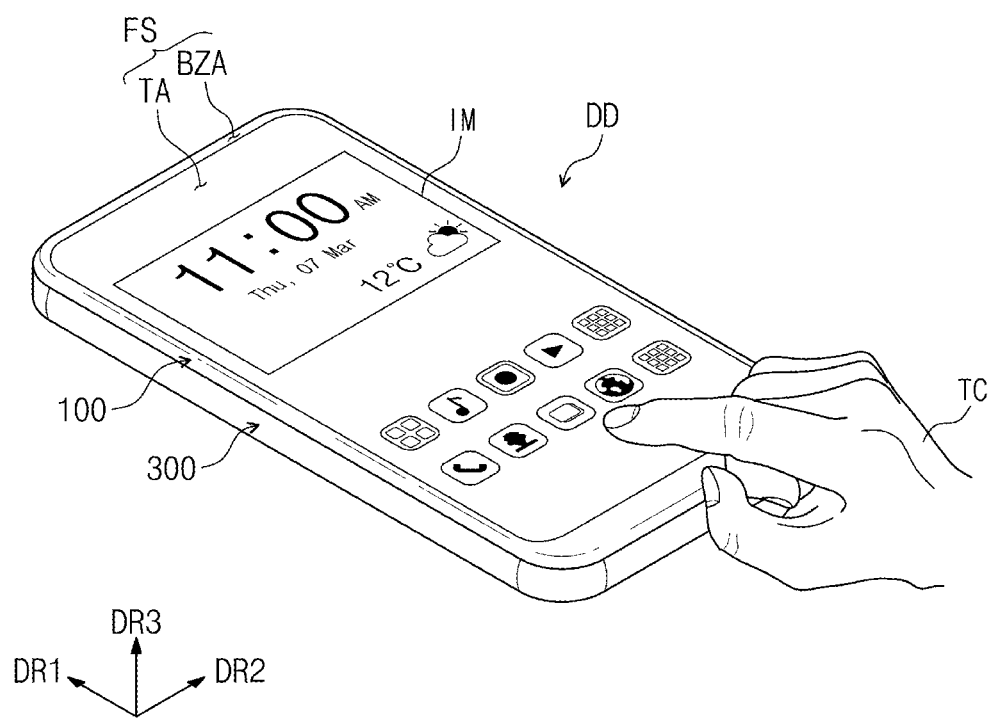
FIG. 1A is an assembled perspective view showing a display device according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

Figure 1B:
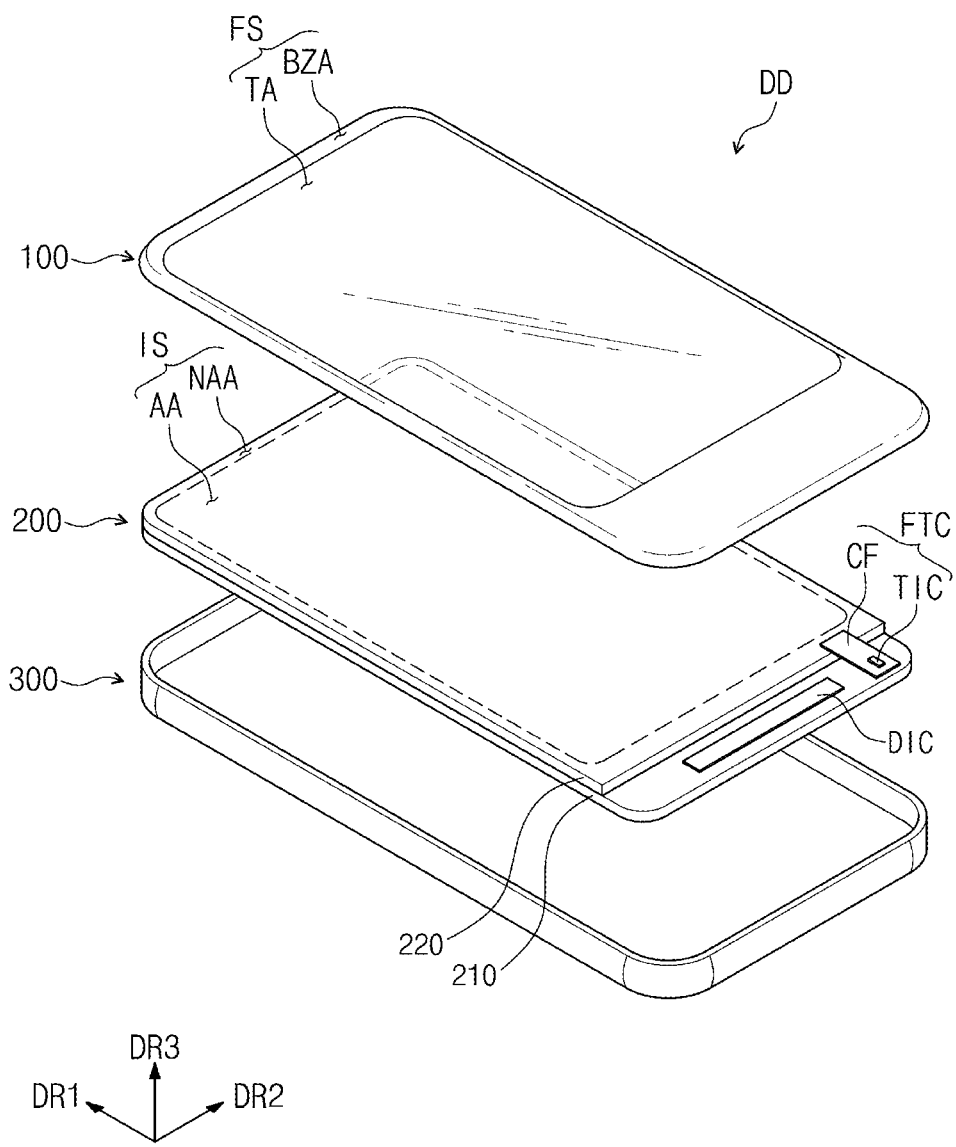
FIG. 1B is an exploded perspective view showing a display device according to an exemplary embodiment of the present disclosure.

FIG. 1A is an assembled perspective view showing a display device DD according to an exemplary embodiment of the present disclosure. FIG. 1B is an exploded perspective view showing the display device DD according to an exemplary embodiment of the present disclosure.

The display device DD may be a device activated in response to electrical signals. The display device DD may include various embodiments. FIG. 1A shows the display device DD applied to a smartphone as a representative example, however, it should not be limited thereto or thereby. For example, the display device DD may be applied to a large-sized electronic item, such as a television set or a monitor, and a small and medium-sized electronic item, such as a mobile phone, a tablet computer, a car navigation unit, a game unit, or a smart watch.

The display device DD may display an image IM through a display surface FS, which is substantially parallel to each of a first direction DR1 and a second direction DR2, toward a third direction DR3. The display surface FS, through which the image IM is displayed, may correspond to a front surface of the display device DD and a front surface FS of a window 100. Hereinafter, the display surface and the front surface of the display device DD and the front surface of the window 100 will be assigned with the same reference numeral. The image IM may include a motion image and a still image. FIG. 1A shows a clock widget and icons as a representative example of the image IM.

In the present exemplary embodiment, front (or upper) and rear (or lower) surfaces of each member of the display device DD may be defined with respect to a direction in which the image IM is displayed. The front and rear surfaces may be opposite to each other in the third direction DR3, and a normal line direction of each of the front and rear surfaces may be substantially parallel to the third direction DR3. A distance in the third direction DR3 between the front surface and the rear surface may correspond to a thickness in the third direction DR3 of a display panel 210. Directions indicated by the first, second, and third directions DR1, DR2, and DR3 are relative to each other, and thus, the directions indicated by the first, second, and third directions DR1, DR2, and DR3 may be changed to other directions.

For example, the display device DD according to the exemplary embodiment of the present disclosure may sense a user input TC (hereinafter, referred to as an "input TC") applied thereto from the outside. The input TC may include inputs of various forms, such as a part of the user's body, light, heat, or pressure. In the present exemplary embodiment, the input TC is shown as a user's hand that touches the front surface. However, this is merely exemplary, and the input TC may be provided in various ways. In addition, the display device DD may sense the input TC applied to a side surface or a rear surface of the display device DD according to a structure of the display device DD.

The display device DD may include the window 100, a display module 200, and a housing 300. In the present exemplary embodiment, the window 100 and the housing 300 are coupled to each other to provide an exterior of the display device DD.

The window 100 may include an insulating panel. For example, the window 100 may include a glass material, a plastic material, or a combination thereof.

The front surface FS of the window 100 may define the front surface of the display device DD as described above. A transmissive area TA may be an optically transparent area. For example, the transmissive area TA may be an area having a visible light transmittance of about 90% or more.

A bezel area BZA may be an area having a relatively lower transmittance as compared with the transmissive area TA. The bezel area BZA may define a shape of the transmissive area TA. The bezel area BZA may be disposed adjacent to the transmissive area TA and may surround the transmissive area TA.

The bezel area BZA may have a predetermined color. The bezel area BZA may cover a peripheral area NAA of the display module 200 to prevent the peripheral area NAA from being viewed from the outside. However, this is merely exemplary, and the bezel area BZA may be omitted from the window 100 according to the exemplary embodiment of the present disclosure.

The display module 200 may display the image IM and may sense the input TC. The image IM may be displayed through the front surface IS of the display module 200. The front surface IS of the display module 200 may include an active area AA and the peripheral area NAA. The active area AA may be an area activated in response to electrical signals.

In the present exemplary embodiment, the active area AA may be an area where the image IM is displayed and the input TC is be sensed. The transmissive area TA may overlap at least the active area AA. For example, the transmissive area TA may overlap an entire surface or at least a portion of the active area AA. Accordingly, a user may view the image IM or may provide the input TC through the transmissive area TA, however, this is merely exemplary. That is, an area through which the image IM is displayed and an area through which the input TC is sensed may be separated from each other in the active area AA, but they should not be limited to a particular embodiment.

The peripheral area NAA may be covered by the bezel area BZA. The peripheral area NAA may be disposed adjacent to the active area AA. The peripheral area NAA may surround the active area AA. A driving circuit or a driving line may be disposed in the peripheral area NAA to drive the active area AA.

The display module 200 may include a display panel 210, an input sensing unit 220, a display driving circuit DIC, and a sensing circuit board FTC.

The display panel 210 may include configurations appropriate to generate the image IM. The image IM generated by the display panel 210 may be viewed outside by the user through the transmissive area TA.

The input sensing unit 220 may sense the input TC applied from the outside. As described above, the input sensing unit 220 may sense the input TC applied to the window 100.

The display driving circuit DIC may be disposed on the display panel 210. The display driving circuit DIC may be mounted on the display panel 210. The display driving circuit DIC may be electrically connected to the display panel 210. The display driving circuit DC may provide electrical signals to the display panel 210 to drive the display panel 210.

The sensing circuit board FTC may be electrically connected to the input sensing unit 220. In the present exemplary embodiment, the sensing circuit board FTC may include a flexible circuit board CF and a sensing driving circuit TIC. The flexible circuit board CF may include sensing lines (not shown). The sensing lines electrically connect the input sensing unit 220 and the sensing driving circuit TIC. The sensing driving circuit TIC may be mounted on the flexible circuit board CF in a chip-on-film scheme. The input sensing unit 220 may receive electrical signals independently from the display panel 210 through the sensing circuit board FTC.

The housing 300 may be coupled to the window 100 to define the exterior of the display device DD. The housing 300 may provide a predetermined inner space. The display module 200 may be accommodated in the inner space.

The housing 300 may have a material with a relatively high rigidity. For example, the housing 300 may include a glass, plastic, or metal material or a plurality of frames and/or plates of combinations thereof. The housing 300 may stably protect the components of the display device DD, which are accommodated in the inner space from external impacts.

Figure 2A:
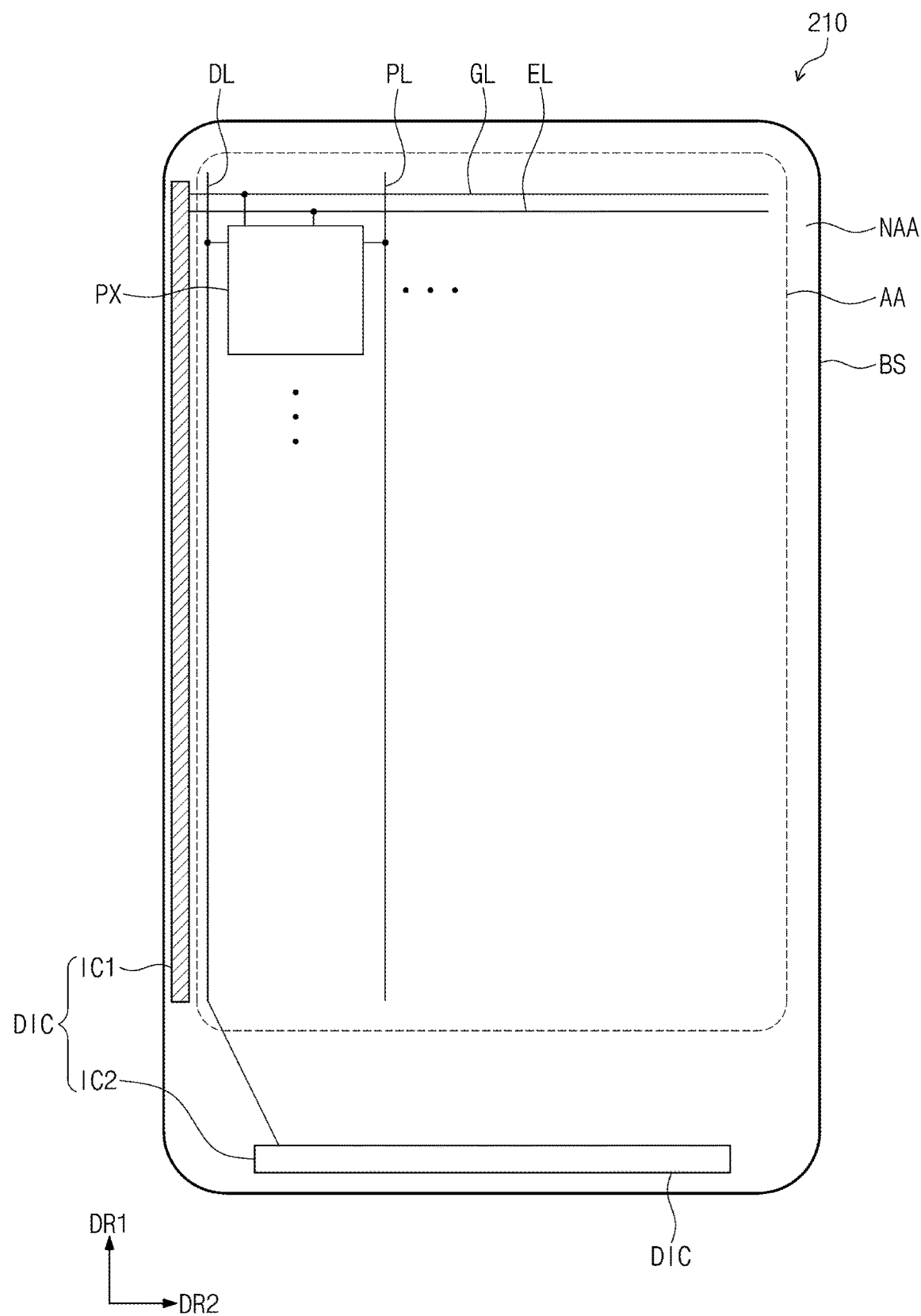
FIG. 2A is a plan view showing a display panel according to an exemplary embodiment of the present disclosure.
Figure 2B:
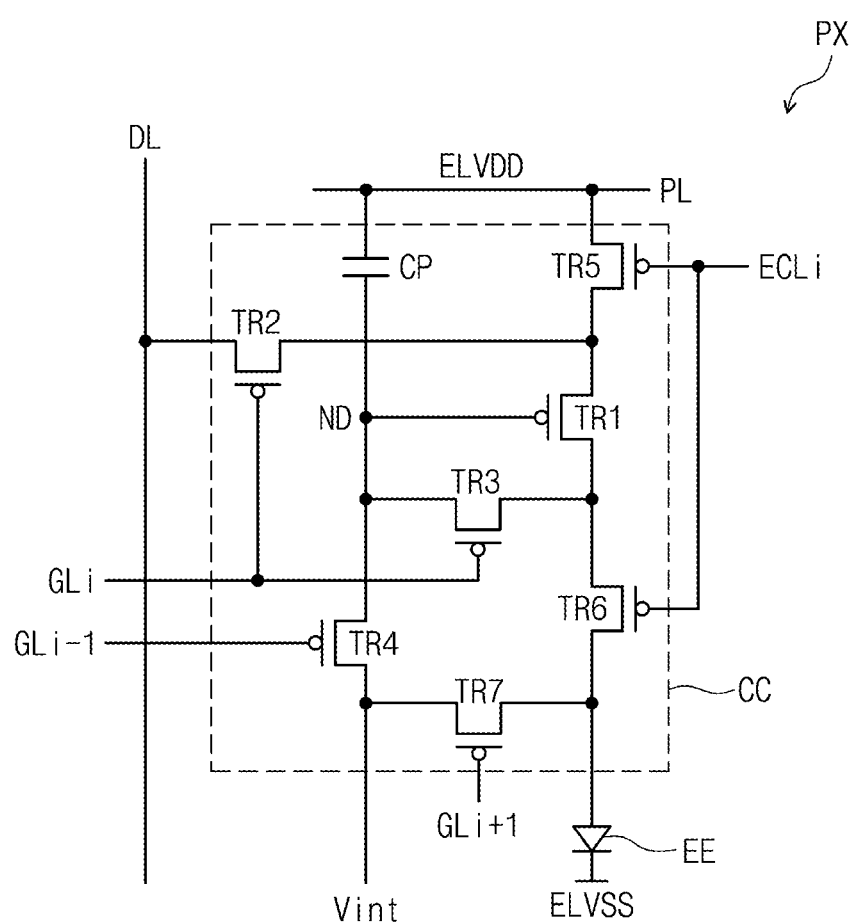
FIG. 2B is an equivalent circuit diagram showing a pixel according to an exemplary embodiment of the present disclosure.
Figure 2C:
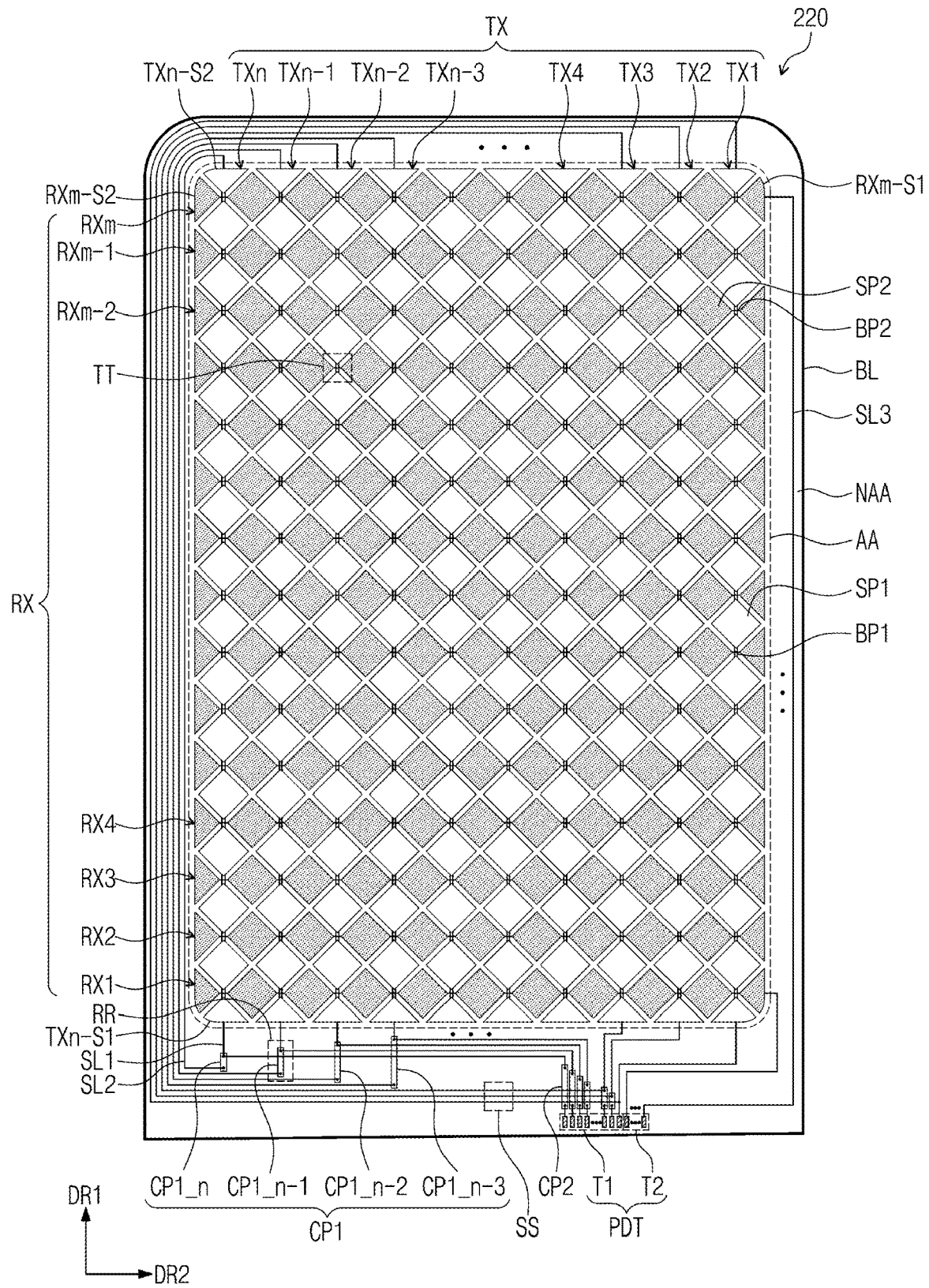
FIG. 2C is a plan view showing an input sensing unit according to an exemplary embodiment of the present disclosure.

FIG. 2A is a plan view showing the display panel 210 according to an exemplary embodiment of the present disclosure. FIG. 2B is an equivalent circuit diagram showing a pixel PX according to an exemplary embodiment of the present disclosure. FIG. 2C is a plan view showing the input sensing unit 220 according to an exemplary embodiment of the present disclosure. For the convenience of descriptions, some components are omitted in FIGS. 2A to 2C.

Referring to FIG. 2A, the display panel 210 may include a base substrate BS, a plurality of pixels PX, a plurality of signal lines GL, DL, PL, and EL, and the display driving circuit DIC. The display driving circuit DIC may include a gate driving circuit IC1 and a data driving circuit IC2.

The base substrate BS of the display panel 210 may include an active area AA and a peripheral area NAA, which are defined therein. The active area AA may be an area through which the image is displayed, and the peripheral area NAA may be an area in which the driving circuit or the driving line is arranged.

The base substrate BS may include an insulating substrate. For example, the base substrate BS may include a glass substrate, a plastic substrate, or a combination thereof.

The signal lines GL, DL, PL, and EL may be connected to the pixels PX to transmit the electrical signals to the pixels PX. Among the signal lines included in the display panel 210, a gate line GL, a data line DL, a light emitting control line ECLi, and a power line PL are shown as a representative example, however, these are merely exemplary. The signal lines GL, DL, PL, and EL may further include at least one of a power line and an initialization voltage line and should not be limited to a particular embodiment.

FIG. 2B shows an enlarged view showing a signal circuit of one pixel PX among the pixels PX. FIG. 2B shows the pixel PX connected to an i-th gate line GLi and an i-th light emitting control line ECLi.

The gate line GL may be provided in plural and may be connected to the gate driving circuit IC1. The gate driving circuit IC1 may sequentially apply gate signals to the gate lines. The pixels PX may be turned on or off in response to the gate signals.

The data line DL may be insulated from the gate line GL while crossing the gate line GL. The data line DL may be provided in plural and may be connected to the data driving circuit IC2. The data driving circuit IC2 may apply data signals to the data lines. The pixel PX may display lights corresponding to the data signals through the active area AA.

The pixel PX may include a light emitting element EE and a pixel circuit CC.

The pixel circuit CC may include a plurality of transistors TR1 to TR7 and a capacitor CP. The transistors TR1 to TR7 may be formed through a low temperature polycrystalline silicon (LTPS) process or a low temperature polycrystalline oxide (LTPO) process.

The pixel circuit CC may control an amount of current flowing through the light emitting element EE in response to the data signal. The light emitting element EE may emit a light at a predetermined luminance in response to the amount of the current provided from the pixel circuit CC. To this end, a first power voltage ELVDD may have a level that is set higher than a level of a second power voltage ELVSS. The light emitting element EE may include an organic light emitting element or a quantum dot light emitting element.

Each of the transistors TR1 to TR7 may include an input electrode (or source electrode), an output electrode (or drain electrode), and a control electrode (or gate electrode). In the following descriptions, for the convenience of explanation, one electrode of the input electrode and the output electrode is referred to as a "first electrode", and the other electrode of the input electrode and the output electrode is referred to as a "second electrode".

A first electrode of a first transistor TR1 may be connected to the first power voltage ELVDD via a fifth transistor TR5, and a second electrode of the first transistor TR1 may be connected to an anode electrode of the light emitting element EE via a sixth transistor TR6. The first transistor TR1 may be referred to as a "driving transistor" in the present disclosure.

The first transistor TR1 may control the amount of the current flowing through the light emitting element EE in response to a voltage applied to a control electrode of the first transistor TR1.

A second transistor TR2 may be connected between the data line DL and the first electrode of the first transistor TR1. A control electrode of the second transistor TR2 may be connected to the i-th gate line GLi. When an i-th gate signal is applied to the i-th gate line GLi, the second transistor TR2 may be turned on and may connect the data line DL to the first electrode of the first transistor TR1.

A third transistor TR3 may be connected between the second electrode of the first transistor TR1 and the control electrode of the first transistor TR1. A control electrode of the third transistor TR3 may be connected to the i-th gate line GLi. When the i-th gate signal is applied to the i-th gate line GLi, the third transistor TR3 may be turned on and may connect the second electrode of the first transistor TR1 to the control electrode of the first transistor TR1. Accordingly, when the third transistor TR3 is turned on, the first transistor TR1 may be connected in a diode configuration.

A fourth transistor TR4 may be connected between a node ND and an initialization power generator (not shown). A control electrode of the fourth transistor TR4 may be connected to an (i−1)th gate line GLi−1. When an (i−1)th gate signal is applied to the (i−1)th gate line GLi−1, the fourth transistor TR4 may be turned on and may provide an initialization voltage Vint to the node ND.

The fifth transistor TR5 may be connected between the power line PL and the first electrode of the first transistor TR1. A control electrode of the fifth transistor TR5 may be connected to the i-th light emitting control line ECLi.

The sixth transistor TR6 may be connected between the second electrode of the first transistor TR1 and the anode electrode of the light emitting element EE. A control electrode of the sixth transistor TR6 may be connected to the i-th light emitting control line ECLi.

A seventh transistor TR7 may be connected between the initialization power generator (not shown) and the anode electrode of the light emitting element EE. A control electrode of the seventh transistor TR7 may be connected to an (i+1)th gate line GLi+1. When an (i+1)th gate signal is applied to the (i+1)th gate line GLi+1, the seventh transistor TR7 may be turned on and may provide the initialization voltage Vint to the anode electrode of the light emitting element EE.

The seventh transistor TR7 may improve a black expression capability. In detail, when the seventh transistor TR7 is turned on, a parasitic capacitance (not shown) of the light emitting element EE is discharged. Accordingly, when implementing a black luminance, the light emitting element EE does not emit the light due to a leakage current from the first transistor TR1, and thus, the black expression capability may be improved.

Additionally, in FIG. 2B, the control electrode of the seventh transistor TR7 is connected to the (i+1)th gate line GLi+1, however, it should not be limited thereto or thereby. According to another embodiment, the control electrode of the seventh transistor TR7 may be connected to the i-th gate line GLi or the (i−1)th gate line GLi−1.

The capacitor CP may be disposed between the power line PL and the node ND. The capacitor CP may be charged with a voltage corresponding to the data signal. When the fifth and sixth transistors TR5 and TR6 are turned on, the amount of the current flowing through the first transistor TR1 may be determined by the voltage charged in the capacitor CP.

In the present disclosure, the pixel PX should not be limited to the equivalent circuit shown in FIG. 2B. According to another embodiment of the present disclosure, the pixel PX may be implemented in various ways to allow the light emitting element EE to emit the light. FIG. 2B shows a PMOS as a reference of the pixel circuit CC, however, it should not be limited thereto or thereby. According to another embodiment, the pixel circuit CC may be implemented by an NMOS. According to another embodiment, the pixel circuit CC may be implemented by a combination of the NMOS and the PMOS.

The input sensing unit 220 may be disposed on the display panel 210. The input sensing unit 220 may sense the input TC (refer to FIG. 1A) and may obtain position or intensity information of the input TC (refer to FIG. 1). The input sensing unit 220 may include a plurality of sensing electrodes TX and RX, a plurality of sensing lines SL1, SL2, and SL3, a plurality of first bridge patterns CP1, a plurality of second bridge patterns CP2, and a plurality of sensing pads PDT.

The sensing electrodes TX and RX may be arranged in the active area AA. The sensing electrodes TX and RX may include a plurality of first sensing electrodes TX and a plurality of second sensing electrodes RX, which receive different electrical signals from each other. The input sensing unit 220 may obtain information about the input TC provided to the active area AA based on a variation in capacitance between the first sensing electrodes TX and the second sensing electrodes RX.

The first sensing electrodes TX may include n first sensing electrodes TX or TX1, TX2, TX3, . . . , Tn spaced apart from each other in the second direction DR2 and extending in the first direction DR1. Hereinafter, the first sensing electrodes TX will be described as being arranged in n columns. In addition, "n" may be an integer number equal to or greater than 5 in consideration of the shape of the input sensing unit 220.

Each of the first sensing electrodes TX1, TX2, TX3, . . . , Tn may include a plurality of first sensing patterns SP1 and a plurality of first connection patterns BP1, which are arranged in the first direction DR1.

The first sensing patterns SP1 may be alternately arranged with the first connection patterns BP1 in the first direction DR1. Each of the first connection patterns BP1 may connect two patterns adjacent to each other among the first sensing patterns SP1.

The second sensing electrodes RX may include m second sensing electrodes RX, or RX1, RX2, RX3, . . . , RXm spaced apart from each other in the first direction DR1 and extending in the second direction DR2. Hereinafter, the second sensing electrodes RX will be described as being arranged in m rows. In addition, "m" may be an integer number equal to or greater than 2.

The second sensing electrodes RX may be insulated from the first sensing electrodes TX.

The second sensing electrodes RX1, RX2, RX3, . . . , RXm may include a plurality of second sensing patterns SP2 and a plurality of second connection patterns BP2, which are arranged in the second direction DR2. The second sensing patterns SP2 may be alternately arranged with the second connection patterns BP2. Each of the second connection patterns BP2 may connect two patterns adjacent to each other among the second sensing patterns SP2.

In the present exemplary embodiment, the first connection patterns BP1 and the second connection patterns BP2 may be disposed on different layers from each other, and the first sensing patterns SP1 and the second sensing pattern SP2 may be disposed on the same layer as each other. For example, the first connection patterns BP1 may be disposed on a different layer from the second connection patterns BP2, the first sensing patterns SP1, and the second sensing patterns SP2, and the second connection patterns BP2 may be disposed on the same layer as the first sensing patterns SP1 and the second sensing patterns SP2.

However, this is merely exemplary. The first connection patterns BP1 may be disposed on the same layer as the first sensing patterns SP1 and the second sensing patterns SP2, or the first sensing electrodes TX and the second sensing electrodes RX may be disposed on different layers from each other, and, they should not be particularly limited.

The sensing pads PDT may include a plurality of first pads T1 and a plurality of second pads T2. The first pads T1 and the second pads T2 may transmit electrical signals from the outside to the first sensing electrodes TX and the second sensing electrodes RX, respectively.

The sensing lines SL1, SL2, and SL3 and the sensing pads PDT may be arranged in the peripheral area NAA. The sensing pads PDT may be respectively connected to the sensing lines SL1, SL2, and SL3. The sensing lines SL1, SL2, and SL3 may include a plurality of first sensing lines LS1, a plurality of second sensing lines SL2, and a plurality of third sensing lines SL3.

The first sensing lines SL1 may be respectively connected to one ends of the first sensing electrodes TX1, TX2, TX3, ..., TXn. As an example, FIG. 2C shows the first sensing line SL1 connected to one end TXn-S1 of opposite ends TXn-S1 and TXn-S2 of an n-th column first sensing electrode TXn.

The first sensing lines SL1 may connect the first pads T1 among the sensing pads PDT to the first sensing electrodes TX1, TX2, TX3, ..., TXn, respectively, and may transmit the electrical signals from the outside to the first sensing electrodes TX1, TX2, TX3, ..., TXn.

The second sensing lines SL2 may be respectively connected to the other ends of the first sensing electrodes TX1, TX2, TX3, ..., TXn. As an example, FIG. 2C shows the second sensing line SL2 connected to the other end TXn-S2 of the opposite ends TXn-S1 and TXn-S2 of the n-th column first sensing electrode TXn. The other ends of the first sensing electrodes TX1, TX2, TX3, ..., TXn may be opposite to the one ends of the first sensing electrodes TX1, TX2, TX3, ..., TXn. For example, the one end TXn-S1 of the n-th column first sensing electrode TXn may be opposite to the other end TXn-S2 of the n-th column first sensing electrode TXn.

In the present disclosure, the first bridge patterns CP1 may connect the first sensing lines SL1 to the second sensing lines SL2, respectively. In detail, the first sensing lines SL1 may be connected to the second sensing lines SL2 through the first bridge patterns CP1 and may transmit the electrical signals to the second sensing lines SL2.

The first bridge patterns CP1 may extend in the first direction DR1 as the first sensing electrodes TX1, TX2, TX3, ..., TXn. In addition, the first sensing electrodes TX1, TX2, TX3, ..., TXn may overlap the first bridge patterns CP1, respectively, in the first direction DR1.

For example, referring to FIG. 2C, an n-th column first bridge pattern CP1_n may overlap the n-th column first sensing electrode TXn in the first direction DR1. An (n−1)th column first bridge pattern CP1_n−1 may overlap the (n−1)th column first sensing electrode TXn−1 in the first direction DR1. An n−2 th column first bridge pattern CP1_n−2 may overlap the n−2 th column first sensing electrode TXn−2 in the first direction DR1. An n−3 th column first bridge pattern CP1_n−3 may overlap the n−3 th column first sensing electrode TXn−3 in the first direction DR1.

Each of the first bridge patterns CP1 may be disposed more adjacent to the one ends of the first sensing electrodes TX1, TX2, TX3, ..., TXn than the other ends of the first sensing electrodes TX1, TX2, TX3, ..., TXn. For example, referring to FIG. 2C, the n-th column first bridge pattern CP1_n may be disposed more adjacent to the one end TXn-S1 than the other end TXn-S2 of the opposite ends TXn-S1 and TXn-S2 of the n-th column first sensing electrode TXn, however, it should not be limited thereto or thereby.

In the present disclosure, the second bridge patterns CP2 may connect the first sensing lines SL1 to the first pads T1. In detail, the first sensing lines SL1 may be respectively connected to the first pads T1 through the second bridge patterns CP2 and may receive electrical signals from the outside.

The first pads T1 may be disposed closer to the second bridge pattern CP2 than the first bridge pattern CP1. In the exemplary embodiment, the electrical signals provided from the outside through the first pads T1 may be transmitted to the first sensing lines SL1 through the second bridge patterns CP2. The electrical signals transmitted to the first sensing lines SL1 may be transmitted to the second sensing lines SL2 through the first bridge patterns CP1.

Accordingly, the second sensing lines SL2 may transmit the electrical signals that are substantially the same as the electrical signals transmitted by the first sensing lines SL1 to the first sensing electrodes TX.

The first sensing electrodes TX having a relatively longer length than that of the second sensing electrodes RX may be double-connected to the first pads T1 through the first sensing lines SL1 and the second sensing lines SL2, and thus, sensitivity of input sensing unit 220 may be uniformly maintained.

In addition, as the first sensing lines SL1 are connected to the second sensing lines SL2 by the first bridge patterns CP1, the input sensing unit 220 may provide the uniform sensitivity over an entire surface of the active area AA without increasing the number of the pads PDT.

In the exemplary embodiment, each of the first bridge patterns CP1 and the second bridge patterns CP2 may include a transparent conductive oxide (TCO). For example, each of the first bridge patterns CP1 and the second bridge patterns CP2 may include an indium tin oxide (ITO) or indium zinc oxide (IZO).

Meanwhile, the third sensing lines SL3 may be connected to one ends of the second sensing electrodes RX1, RX2, RX3, ..., RXm. For example, FIG. 2C shows the third sensing line SL3 connected to one end RXm-S1 of opposite ends RXm-S1 and RXm-S2 of an m-th row second sensing electrode RXm. The one ends of the second sensing electrodes RX1, RX2, RX3, ..., RXm may be portions relatively adjacent to the sensing pads PDT. As an example, the one end RXm-S1 of the opposite ends RXm-S1 and RXm-S2 of the m-th row second sensing electrode RXm may be disposed more adjacent to the sensing pads PDT than the other ends RXm-S2 is.

The third sensing lines SL3 may connect the second pads T2 among the sensing pads PDT and the second sensing electrodes RX1, RX2, RX3, ..., RXm, respectively. The electrical signals provided from the outside may be transmitted to the second sensing electrodes RX1, RX2, RX3, ..., RXm from the second pads T2 through the third sensing lines SL3.

Figure 3A:
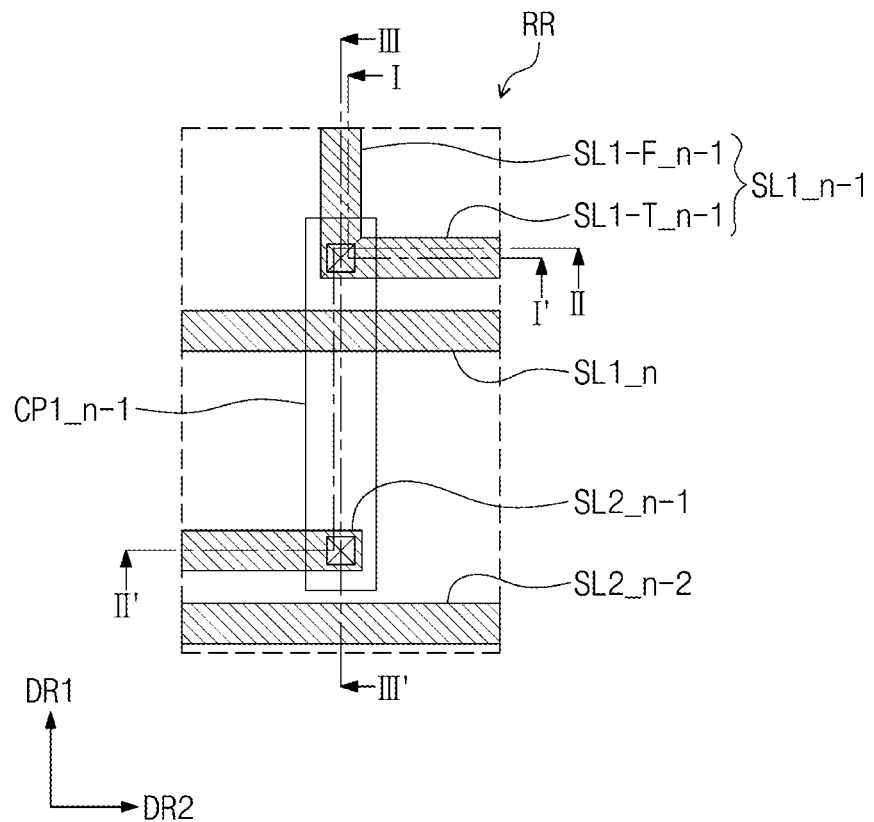
FIG. 3A is an enlarged view showing an area RR shown in FIG. 2C.
Figure 3B:
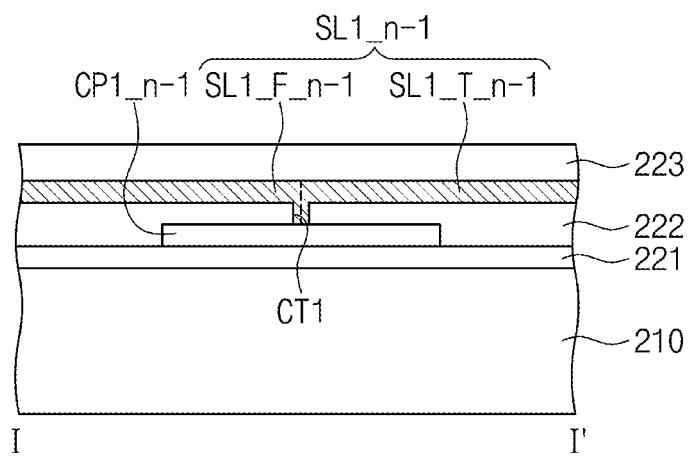
FIG. 3B is a cross-sectional view taken along a line I-I' shown in FIG. 3A.
Figure 3C:
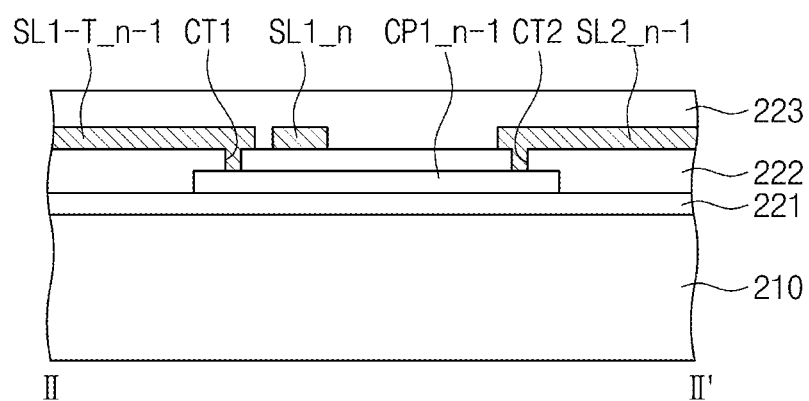
FIG. 3C is a cross-sectional view taken along a line II-II' shown in FIG. 3A.
Figure 3D:
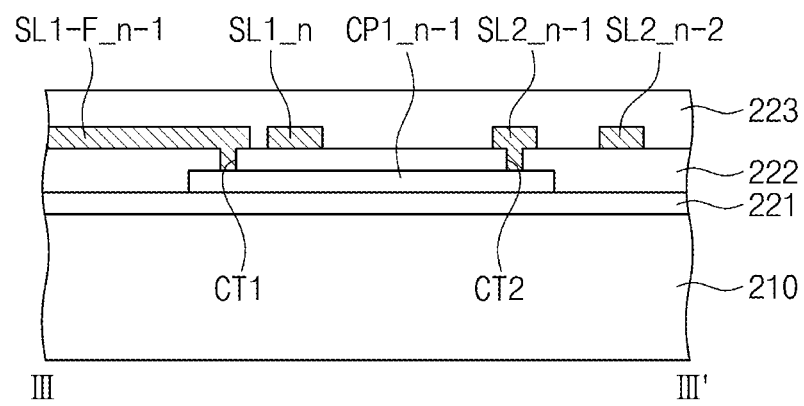
FIG. 3D is a cross-sectional view taken along a line III-III' shown in FIG. 3A.

FIG. 3A is an enlarged view showing an area RR shown in FIG. 2C. FIG. 3B is a cross-sectional view taken along a line I-I' shown in FIG. 3A. FIG. 3C is a cross-sectional view taken along a line II-II' shown in FIG. 3A. FIG. 3D is a cross-sectional view taken along a line III-III' shown in FIG. 3A.

Hereinafter, an (n−1)th column first bridge pattern CP1_n−1 will be described as a representative example to explain the first sensing lines SL1, the second sensing lines SL2, the first bridge patterns CP1, and the second bridge patterns CP2.

Referring to FIGS. 2C and 3A, the area RR may be an area in which the (n−1)th column first bridge pattern CP1_n−1 connects an (n−1)th column first sensing line SL1_n−1 and an (n−1)th column second sensing line SL2_n−1.

In addition, when viewed in a plane, the (n−1)th column first bridge pattern CP1_n−1 may overlap the (n−1)th column first sensing line SL1_n−1, an n-th column first sensing line SL1_n, and the (n−1)th column second sensing line SL2_n−1.

The (n−1)th column first sensing line SL1_n−1 may be, for the convenience of description, divided into an (n−1)th column first front sensing line SL1-F_n−1 and an (n−1)th column first rear sensing line SL1-T_n−1. The (n−1)th column first rear sensing line SL1-T_n−1 may extend from the (n−1)th column first front sensing line SL1-F_n−1, and the (n−1)th column first front sensing line SL1-F_n−1 and the (n−1)th column first rear sensing line SL1-T_n−1 may be defined as one line.

The (n−1)th column first front sensing line SL1-F_n−1 may extend in the first direction DR1, and the (n−1)th column first rear sensing line SL1-T_n−1 may extend in the second direction DR2.

A cross point at which the (n−1)th column first front sensing line SL1-F_n−1 crosses the (n−1)th column first rear sensing line SL1-T_n−1 may overlap the (n−1)th column first bridge pattern CP1_n−1.

In the exemplary embodiment, the (n−1)th column first front sensing line SL1-F_n−1 may extend in the first direction DR1 and may connect an (n−1)th column sensing electrode TXn−1 and the (n−1)th column first bridge pattern CP1_n−1.

In the exemplary embodiment, the (n−1)th column first rear sensing line SL1-T_n−1 may extend in the second direction DR2 and may connect the (n−1)th column first bridge pattern CP1_n−1 and an (n−1) column second bridge pattern corresponding to the (n−1)th column first bridge pattern CP1_n−1.

Referring to FIG. 3B, the (n−1)th column first bridge pattern CP1_n−1 may be disposed on a first sensing insulating layer 221, and the (n−1)th column first sensing line SL1_n−1 may be disposed between a second sensing insulating layer 222 and a third sensing insulating layer 223. The (n−1)th column first sensing line SL1_n−1 may be electrically connected to the (n−1)th column first bridge pattern CP1_n−1 through a first contact hole CT1.

Referring to FIGS. 3A and 3C, the (n−1)th column first rear sensing line SL1-T_n−1 and the (n−1)th column second sensing line SL2_n−1 may be disposed between the second sensing insulating layer 222 and the third sensing insulating layer 223.

In the exemplary embodiment, the (n−1)th column first rear sensing line SL1-T_n−1 may be electrically connected to the (n−1)th column second sensing line SL2_n−1. In detail, the (n−1)th column first rear sensing line SL1-T_n−1 may be connected to the (n−1)th column first bridge pattern CP1_n−1 through the first contact hole CT1, and the (n−1)th column second sensing line SL2_n−1 may be connected to the (n−1)th column first bridge pattern CP1_n−1 through a second contact hole CT2.

That is, in the present exemplary embodiment, first rear sensing lines SL1-T may transmit the electrical signals provided from the first pads T1 to first front sensing lines SL1-F and the second sensing lines SL2. Accordingly, the first sensing electrode TX of the input sensing unit 220 may be double-connected to the first pads T1 through the first sensing line SL1 and the second sensing line SL2, however, only the first sensing lines SL1 may be connected directly to the first pads T1. Thus, the number of the lines connected to the first pads T1 may be reduced.

Referring to FIG. 3D, the (n−1)th column first front sensing line SL1-F_n−1, an (n−1)th column first front sensing line SL1-F_n−1, the (n−1)th column second sensing line SL2_n−1, and an (n−2)th column second sensing line SL2_n−2 may be disposed between the second sensing insulating layer 222 and the third sensing insulating layer 223.

The first sensing lines SL1 and the second sensing lines SL2 may be disposed on a layer different from a layer on which the first bridge patterns CP1 are disposed. In FIGS. 3B to 3D, the first sensing lines SL1 and the second sensing lines SL2 may be disposed on the second sensing insulating layer 222, and the first bridge patterns CP1 may be disposed on the first sensing insulating layer 221, however, they should not be limited thereto or thereby. According to another embodiment, the first sensing lines SL1 and the second sensing lines SL2 may be disposed on the first sensing insulating layer 221, and the first bridge patterns CP1 may be disposed on the second sensing insulating layer 222.

Although not shown in figures, the second bridge patterns CP2 may be disposed on the same layer as the first bridge patterns CP1. In more detail, the second bridge patterns CP2 may be disposed on the first sensing insulating layer 221 and may connect the first sensing lines SL1 to the first pads T1, respectively.

Referring to FIGS. 2C and 3D, the (n−1)th column first bridge pattern CP1_n−1 may overlap the n-th column first sensing line SL1_n when viewed in a plane. The n-th column first sensing line SL1_n and the (n−1)th column first bridge pattern CP1_n−1 are disposed on different layers with the second sensing insulating layer 222 interposed therebetween and are insulated from each other. The n-th column first sensing line SL1_n may connect the n-th column first sensing electrode TXn to the first pad T1 corresponding to the n-th column first sensing electrode TXn.

Meanwhile, since the n-th column first sensing line SL1_n is disposed on the (n−1)th column first bridge pattern CP1_n−1 to be disposed between the (n−1)th column first front sensing line SL1-F_n−1 and the (n−1)th column second sensing line SL2_n−1, a length of the (n−1)th column first bridge pattern CP1_n−1 may be longer than a length of the n-th column first bridge pattern CP1_n.

Descriptions about the n-th column and the (n−1)th column in FIGS. 3A to 3D may be applied to other columns of the first sensing lines SL1, the second sensing lines SL2, and the first bridge patterns CP1.

Figure 4A:
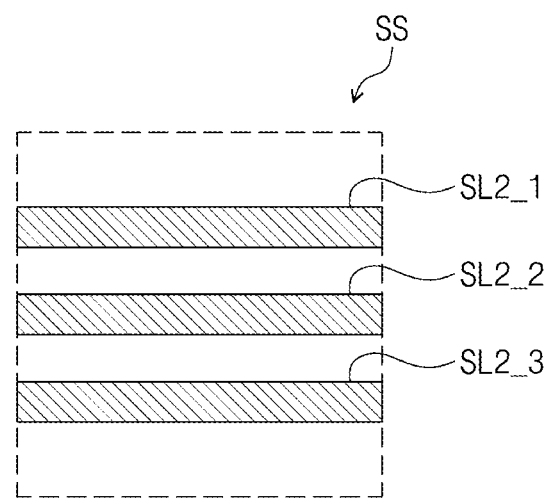
FIG. 4A is an enlarged view showing an area SS shown in FIG. 2C.
Figure 4B:
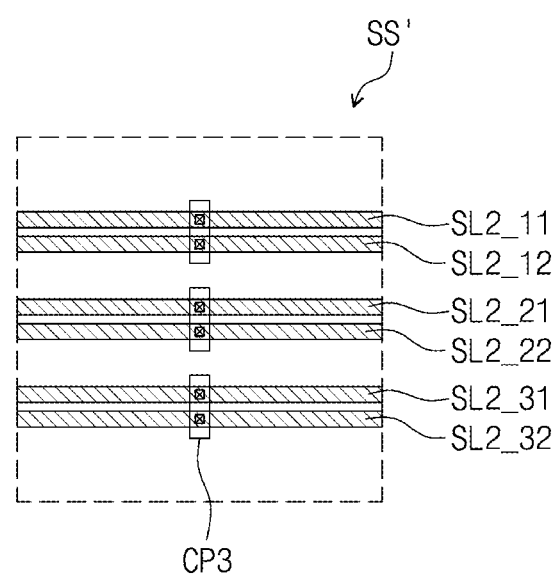
FIG. 4B is an enlarged view showing another exemplary embodiment of the area SS shown in FIG. 2C.

FIG. 4A is an enlarged view showing an area SS shown in FIG. 2C. FIG. 4B is an enlarged view showing another exemplary embodiment of the portion SS shown in FIG. 2C.

Referring to FIGS. 2C and 4A, the area SS shows a first-column second sensing line SL2_1, a second-column second sensing line SL2_2, and a third-column second sensing line SL2_3, which are respectively connected to the other ends of a first-column sensing electrode TX1, a second-column sensing electrode TX2, and a third-column sensing electrode TX3.

As shown in FIG. 2C, the first sensing lines SL1 may be respectively connected to the first pads T1 through the second bridge patterns CP2 such that the first sensing lines SL1 do not intersect with the first-column second sensing line SL2_1, the second-column second sensing line SL2_2, and the third-column second sensing line SL2_3. As described above, the second bridge patterns CP2 may be disposed under the first sensing lines SL1 and the second sensing lines SL2. Accordingly, the first sensing lines SL1 and the first pads T1 may be respectively connected to the second bridge patterns CP2 through contact holes (not shown).

For the above-mentioned effect, the second bridge patterns CP2 may have a width greater than a sum of widths of the first-column second sensing line SL2_1, the second-column second sensing line SL2_2, and the third-column second sensing line SL2_3. Therefore, as the width of each of the first-column second sensing line SL2_1, the second-column second sensing line SL2_2, and the third-column second sensing line SL2_3 decreases, the width of the second bridge patterns CP2 may decrease.

For example, as shown in FIG. 4A, in the case where each of the first-column second sensing line SL2_1, the second-column second sensing line SL2_2, and the third-column second sensing line SL2_3 has a one-line structure, the width of the second bridge patterns CP2 may be minimized.

However, the exemplary embodiment should not be limited thereto or thereby. Referring to FIG. 4B, each of the first-column second sensing line SL2_1, the second-column second sensing line SL2_2, and the third-column second sensing line SL2_3 may have a structure in which two lines are connected to a third bridge pattern CP3.

For example, the first-column second sensing line SL2_1 may include first-column second sub-sensing lines SL2_11 and SL2_12. The first-column second sub-sensing lines SL2_11 and SL2_12 may be connected to each other through the third bridge pattern CP3, and thus may transmit the same signal.

In the exemplary embodiment, the third bridge pattern CP3 may be disposed under the first sensing lines SL1 and the second sensing lines SL2 as the first bridge pattern CP1 and the second bridge pattern CP2.

The second-column second sensing line SL2_2 may include second-column second sub-sensing lines SL2_21 and SL2_22. The third-column second sensing line SL2_3 may include third-column second sub-sensing lines SL2_31 and SL2_32. The second-column second sub-sensing lines SL2_21 and SL2_22 may be connected to each other through the third bridge pattern CP3, and the third-column second sub-sensing lines SL2_31 and SL2_32 may be connected to each other through the third bridge pattern CP3.

Figure 5A:
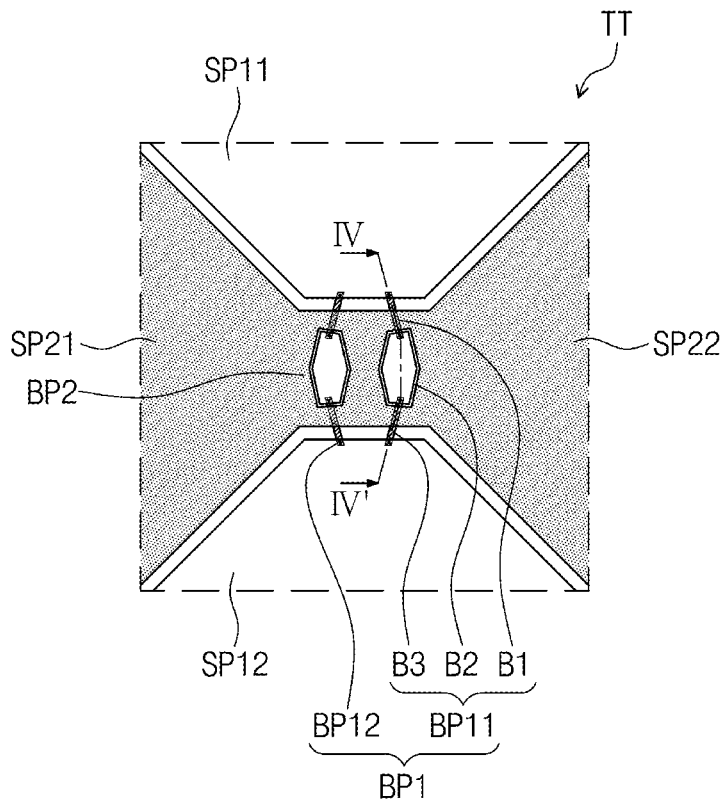
FIG. 5A is an enlarged view showing an area TT shown in FIG. 2C.
Figure 5B:
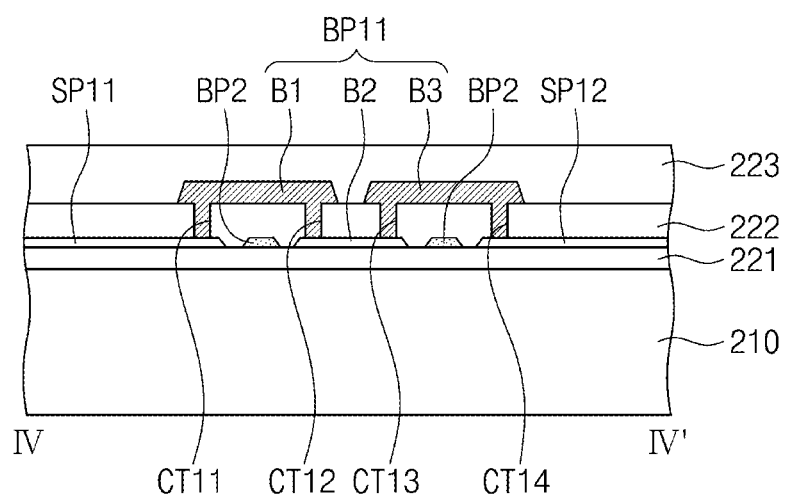
FIG. 5B is a cross-sectional view taken along a line IV-IV' shown in FIG. 5A.
Figure 5C:
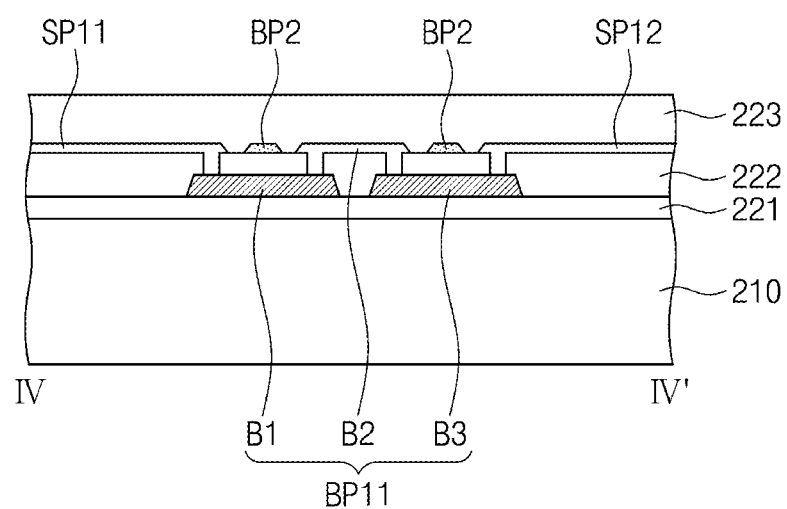
FIG. 5C is a view showing another exemplary embodiment of the area taken along a line IV-IV' shown in FIG. 5A.

FIG. 5A is an enlarged view showing an area TT shown in FIG. 2C. FIG. 5B is a cross-sectional view taken along a line IV-IV' shown in FIG. 5A. FIG. 5C is a view showing another exemplary embodiment of the area taken along the line IV-IV' shown in FIG. 5A.

Referring to FIGS. 2C and 5A, the area TT may be an area in which the first connection pattern BP1 intersects with the second connection pattern BP2. For the convenience of explanation, FIG. 5A shows two first sensing patterns SP11 and SP12 connected to one first connection pattern BP1 among the first sensing patterns SP1 and two second sensing patterns SP21 and SP22 connected to one second connection pattern BP2 among the second sensing patterns.

Referring to FIGS. 5A and 5B, the first sensing patterns SP11 and SP12 may be disposed to be spaced apart from the second sensing patterns SP21 and SP22 when viewed in a plane. The first sensing patterns SP11 and SP12 may be disposed on the same layer as the second sensing patterns SP21 and SP22. The first sensing patterns SP11 and SP12 may be electrically insulated from the second sensing patterns SP21 and SP22. In the present exemplary embodiment, the second sensing patterns SP21 and SP22 may be provided integrally with the second connection pattern BP2.

The first connection pattern BP1 may intersect with the second connection pattern BP2 when viewed in a plane. The first connection pattern BP1 and the second connection pattern BP2 may be disposed on different layers from each other when viewed in a cross-section. The first connection pattern BP1 may include a plurality of patterns BP11 and BP12 spaced apart from each other.

The first sensing patterns SP11 and SP12 may be connected to each other through the patterns BP11 and BP12. Accordingly, although one of the patterns BP11 and BP12 is damaged, an electrical connection between the first sensing patterns SP11 and SP12 may be stably maintained.

Each of the patterns BP11 and BP12 may include a first portion B1, a second portion B2, and a third portion B3. The first portion B1 may connect one first pattern SP11 of the first sensing patterns SP11 and SP12 to the second portion B2, and the third portion B3 may connect the other first pattern SP12 of the first sensing patterns SP11 and SP12 to the second portion B2.

In the exemplary embodiment, the first portion B1 and the third portion B3 may be disposed between the second sensing insulating layer 222 and the third sensing insulating layer 223. The second portion B2 may be disposed between the first sensing insulating layer 221 and the second sensing insulating layer 222.

The first sensing patterns SP11 and SP12 may be disposed on the same layer as the second portion B2. The first sensing patterns SP11 and SP12 and the second portion B2 may be disposed to be spaced apart from each other. The first portion B1 and the third portion B3 may be connected to the first sensing patterns SP11 and SP12 and the second portion B2 after penetrating through the second sensing insulating layer 222.

Meanwhile, the second portion B2 may be disposed on the same layer as the second connection pattern BP2. In the present exemplary embodiment, the second portion B2 may be disposed in a predetermined opening (not shown) defined through the second connection pattern BP2. The second portion B2 may be disposed to be spaced apart from the second connection pattern BP2 when viewed in a plane. The second portion B2 may be electrically insulated from the second connection pattern BP.

In the present exemplary embodiment, the first connection pattern BP1 may include a different material from the second connection pattern BP2. In the present exemplary embodiment, the second portion B2 of the first connection pattern BP1 and the second connection pattern BP2 may be optically transparent. The first portion B1 and the third portion B3 of the first connection pattern BP1 may be optically opaque. In detail, the second portion B2 and the second connection pattern BP2 may include a transparent conductive oxide (TCO). For example, the second portion B2 and the second connection pattern BP2 may include indium tin oxide (ITO). The first portion B1 and the third portion B3 may include a metal material or a conductive polymer.

However, this is merely exemplary. In the input sensing unit according to the exemplary embodiment of the present disclosure, the first connection pattern BP1 may be optically opaque, and the second connection pattern BP2 may be optically transparent. As another way, both the first connection pattern BP1 and the second connection pattern BP2 may be optically transparent or optically opaque, or the first connection pattern BP1 and the second connection pattern BP2 may include the same material. The input sensing unit according to the exemplary embodiment of the present disclosure may be implemented in various embodiments, and, it should not be particularly limited.

FIG. 5C shows another exemplary embodiment of the area TT. In the present exemplary embodiment, a first portion B1 and a third portion B3 may be disposed between a first sensing insulating layer 221 and a second sensing insulating layer 222. A second portion B2 may be disposed between the second sensing insulating layer 222 and a third sensing insulating layer 223.

First sensing patterns SP11 and SP12 may be disposed on the same layer as the second portion B2. The first sensing patterns SP11 and SP12 and the second portion B2 may be disposed to be spaced apart from each other. The first sensing patterns SP11 and SP12 and the second portion B2 may be connected to the first portion B1 and the third portion B3 after penetrating through the second sensing insulating layer 222.

The input sensing unit according to the present disclosure may have a variety of shapes as long as the first sensing patterns SP 11 and SP12 are electrically insulated from the second sensing patterns SP21 and SP22, and it should not be particularly limited.

Figure 6A:
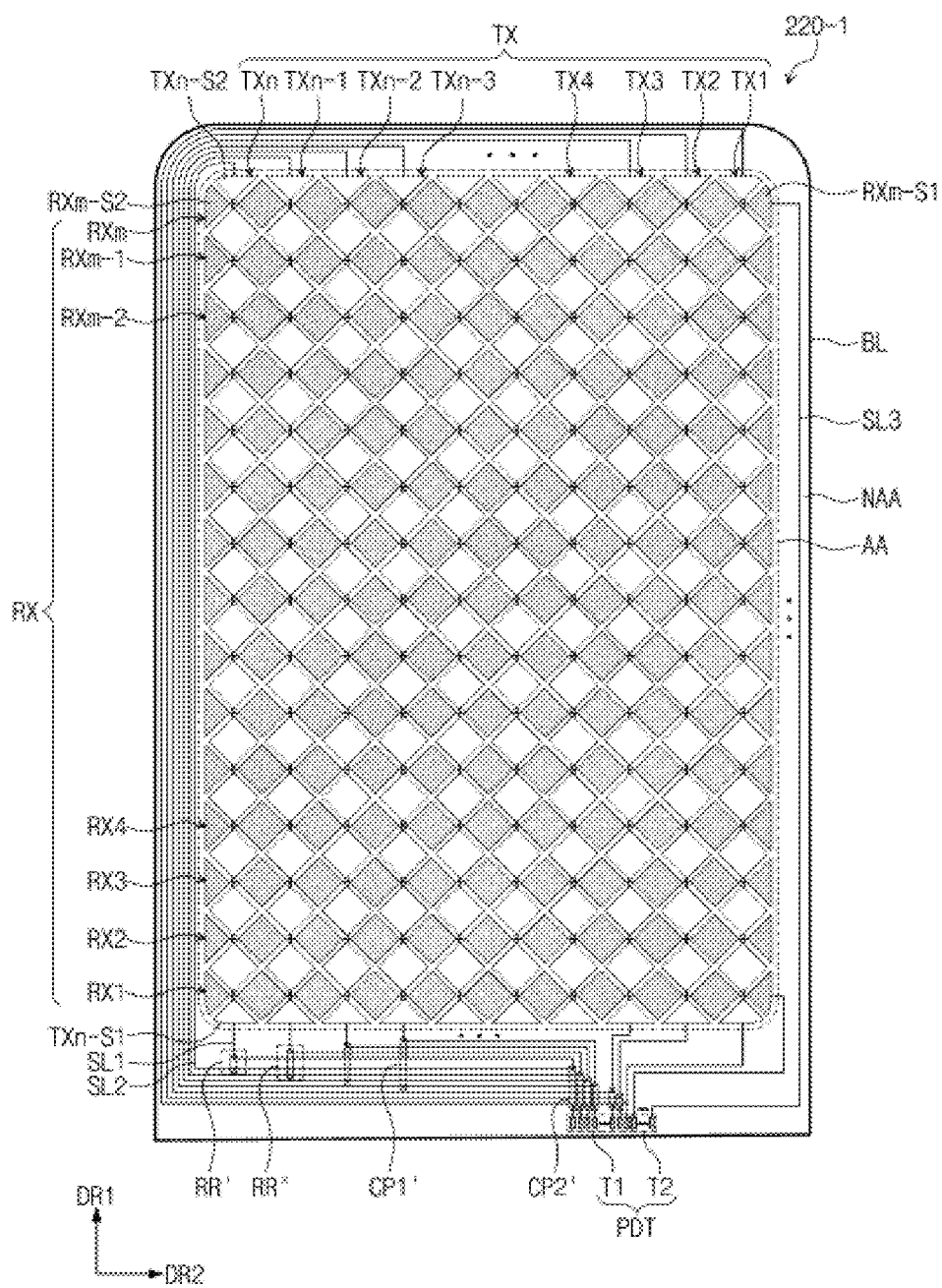
FIG. 6A is a plan view showing an input sensing unit according to an exemplary embodiment of the present disclosure.
Figure 6B:
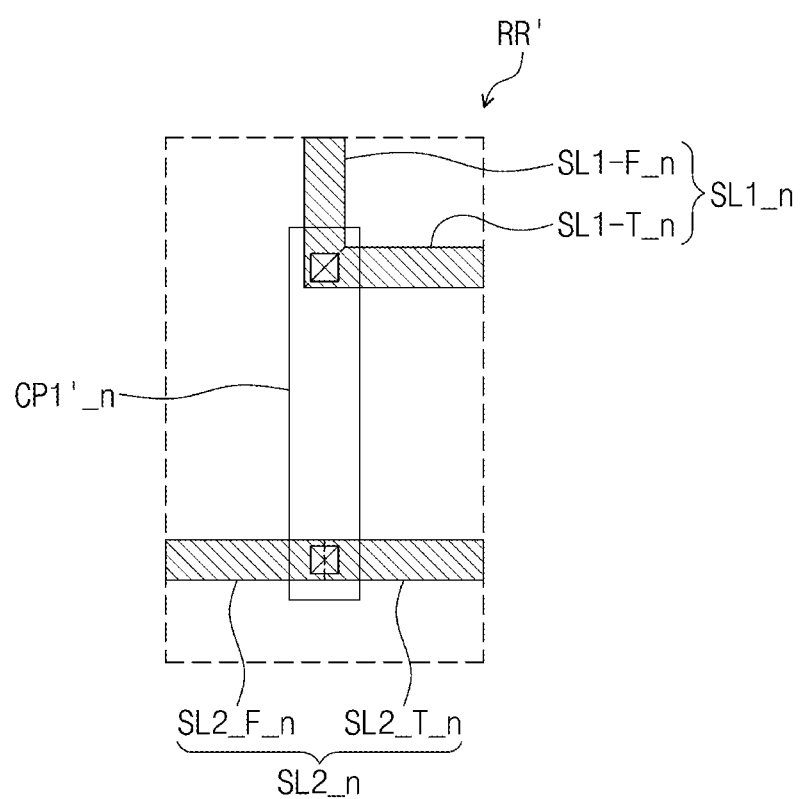
FIG. 6B is an enlarged view showing a portion of an area RR' shown in FIG. 6A.

FIG. 6A is a plan view showing an input sensing unit 220-1 according to an exemplary embodiment of the present disclosure. FIG. 6B is an enlarged view showing a portion of an area RR' shown in FIG. 6A.

Figure 6C:
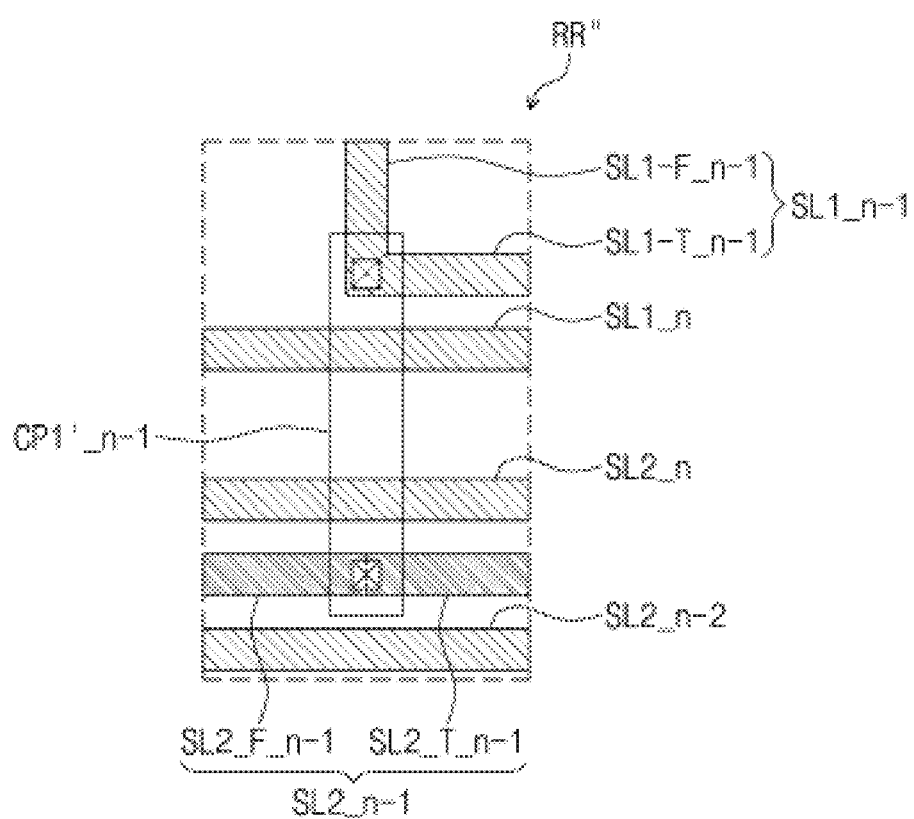
FIG. 6C is an enlarged view showing a portion of an area RR" shown in FIG. 6A.

Meanwhile, FIGS. 6A to 6C show another exemplary embodiment of the input sensing unit 220 of FIGS. 2C and 3A.

In FIGS. 6A to 6C, the same reference numerals denote the same elements in FIGS. 2C and 3A, and thus, detailed descriptions of the same elements will be omitted.

Referring to FIGS. 6A and 6B, an area RR' may be an area in which an n-th column first bridge pattern CP1'_n connects an n-th column first sensing line SL1_n and an n-th column second sensing line SL2_n.

The n-th column first sensing line SL1_n may be defined as an n-th column first front sensing line SL1-F_n and an n-th column first rear sensing line SL1-T_n. The descriptions described with reference to FIG. 2C may be applied to this configuration. In detail, the n-th column first rear sensing line SL1-T_n may connect the n-th column first bridge pattern CP1'_n and an n-th column second bridge pattern CP2'_n corresponding to the n-th column first bridge pattern CP1'_n.

The n-th column second sensing line SL2_n may include an n-th column second front sensing line SL2-F_n and an n-th column second rear sensing line SL2-T_n. The n-th column second rear sensing line SL2-T_n may extend from the n-th column second front sensing line SL2-F_n, and the n-th column second front sensing line SL2-F_n and the n-th column second rear sensing line SL2-T_n may be defined as one line.

The n-th column second rear sensing line SL2-T_n may connect the n-th column first bridge pattern CP1'_n and the second bridge pattern CP2'(shown in FIG. 6A) corresponding to the n-th column first bridge pattern CP1'_n.

Accordingly, the n-th column first rear sensing line SL1-T_n and the n-th column second rear sensing line SL2-T_n may respectively be connected to the n-column second bridge pattern CP2'_n. Even though one of the n-th column first rear sensing line SL1-T_n and the n-th column second rear sensing line SL2-T_n is damaged, the electrical connection between the first pads T1 and the first sensing electrodes TX may be stably maintained.

Referring to FIGS. 6A and 6C, an area RR" may be an area in which an (n-1)th column first bridge pattern CP1'_n-1 connects an (n-1)th column first sensing line SL1_n-1 and an (n-1)th column second sensing line SL2_n-1.when viewed in a plane, the (n-1)th column first bridge pattern CP1_n-1 may overlap the n-th column first sensing line SL1_n, and the n-th column second sensing line SL2_n.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. An input sensing unit comprising:
    a first sensing electrode extending in a first direction;
    a second sensing electrode extending in a second direction crossing the first direction and insulated from the first sensing electrode;
    a first sensing line connected to one end of the first sensing electrode;
    a second sensing line connected to the other end of the first sensing electrode; a
    third sensing line connected to one end of the second sensing electrode;
    a first bridge pattern extending in the first direction and connecting the first sensing line and the second sensing line;
    a fourth sensing line connected to one end of a third sensing electrode extending in a first direction and spaced apart from the first sensing electrode in the second direction; and
    a second bridge pattern extending in the first direction and connecting the fourth sensing line and substantially parallel to the first bridge pattern in the second direction,
    wherein:
    the fourth sensing line overlaps the first bridge pattern; and
    the bridge patterns are spaced apart from pads.

2. The input sensing unit of claim 1, wherein the fourth sensing line comprises:
    a front sensing line connecting the one end of the third sensing electrode to the second bridge pattern; and
    a rear sensing line extended from the front sensing line in the second direction, and
    wherein the first bridge pattern overlaps the rear sensing line of the fourth sensing line.

3. The input sensing unit of claim 2, wherein the front sensing and the rear sensing line are defined as one line.

4. The input sensing unit of claim 2, further comprising a third bridge pattern extending in the first direction and connecting the rear sensing line and a corresponding pad of the pads,
    wherein the first to third bridge patterns are spaced apart from each other in the second direction.

5. The input sensing unit of claim 4, wherein the third bridge pattern is closer to the pad than the first bridge in the second direction.

6. The input sensing unit of claim 4, wherein:
    the third bridge pattern overlaps at least one sensing line different from the fourth sensing line; and
    the sensing line is disposed on a different layer from the third bridge pattern.

7. The input sensing unit of claim 1, wherein the one end of the first sensing electrode is closer to the first bridge pattern than the other end of the first sensing electrode in the first direction.

8. The input sensing unit of claim 1, wherein the other end of the first sensing electrode is closer to the first bridge pattern than the one end of the first sensing electrode in the first direction.

9. A display device comprising:
- a display panel comprising a plurality of light emitting elements; and
- an input sensing unit disposed on the display panel, the input sensing unit comprising:
- a base layer;
- a first sensing electrode disposed on the base layer and extending in a first direction;
- a second sensing electrode extending in a second direction crossing the first direction and insulated from the first sensing electrode;
- a first sensing line connected to one end of the first sensing electrode;
- a second sensing line connected to the other end of the first sensing electrode;
- a third sensing line connected to one end of the second sensing electrode;
- a fourth sensing line connected to one end of a third sensing electrode extending in a first direction and spaced apart from the first sensing electrode in the second direction;
- a first bridge pattern extending in the first direction and connecting the first sensing line and the second sensing line;
- a second bridge pattern connecting the fourth sensing line and substantially parallel to the first bridge pattern in the second direction; and
- a third bridge pattern substantially parallel to the first bridge pattern in the second direction, wherein:
- the first bridge pattern extends in the first direction and overlaps the fourth sensing line; and
- the bridge patterns are spaced apart from pads.

10. The display device of claim 9, wherein the third bridge pattern is closer to the pads than the first bridge pattern.

11. The display device of claim 9, wherein: the third bridge pattern overlaps at least one of sensing line different from the fourth sensing line; and the sensing line disposed on a different layer from the third bridge pattern.

12. The display device of claim 9, wherein the one end of the first sensing electrode is closer to the first bridge pattern than the other end of the first sensing electrode in the first direction.

13. The display device of claim 9, wherein the other end of the first sensing electrode is closer to the first bridge pattern than the one end of the first sensing electrode in the first direction.

* * * * *